United States Patent [19]
Schade, Jr.

[11] 4,345,213
[45] Aug. 17, 1982

[54] DIFFERENTIAL-INPUT AMPLIFIER CIRCUITRY WITH INCREASED COMMON-MODE VOLTAGE RANGE

[75] Inventor: Otto H. Schade, Jr., North Caldwell, N.J.

[73] Assignee: RCA Corporation, New York, N.Y.

[21] Appl. No.: 125,645

[22] Filed: Feb. 28, 1980

[51] Int. Cl.³ .......................... H03F 3/45; G06G 7/24
[52] U.S. Cl. ..................................... 330/253; 307/492; 307/499; 330/257; 330/258; 330/288
[58] Field of Search ............... 330/253, 257, 258, 288; 307/297, 492, 499; 323/365, 316; 328/145

[56] References Cited

U.S. PATENT DOCUMENTS

| | | | |
|---|---|---|---|
| 3,454,894 | 7/1969 | Voorhoeve | 330/253 |
| 3,487,323 | 12/1969 | Schaefer | 307/235 |
| 3,492,497 | 1/1970 | Gilmour et al. | 307/492 |
| 3,513,405 | 5/1970 | Carlson | 307/304 |
| 3,614,645 | 10/1971 | Wheatley, Jr. | 330/255 |
| 3,644,838 | 2/1972 | Graf | 330/3 |
| 3,746,893 | 7/1973 | De Bretagne | 307/304 |
| 3,979,689 | 9/1976 | Schade, Jr. | 330/257 |
| 4,008,441 | 2/1977 | Schade, Jr. | 330/288 |
| 4,071,830 | 1/1978 | Huntington | 330/277 |
| 4,092,548 | 5/1978 | Beilstein, Jr. et al. | 307/205 |

OTHER PUBLICATIONS

"L120 Dual Differential Input Amplifier", *Electronic Design*, vol. 21, No. 4, Feb. 15, 1973, p. A9.
Erdi, "A 300 V/US Monolithic Voltage Follower", *Digest of Technical Papers, 1979 IEEE International Solid State Circuits Conference*, pp. 238-239, Feb. 16, 1979.
Griswold, *RCA Insulated Gate MOS Field-Effect Transistors*, Publication No. ST-2990A, pp. 1-9, undated.
Intersil, Data Sheet for ICL761X etc., Low Power MAXMOS Operational Amplifiers, 1976.
Motorola, Data Sheet for MC14573, 1978.

*Primary Examiner*—James B. Mullins
*Attorney, Agent, or Firm*—Eugene M. Whitacre; Paul J. Rasmussen; Clement A. Berard, Jr.

[57] ABSTRACT

A differential-input amplifier suitable for the input stage of a CMOS operational amplifier has the capability of amplifying input signals with common-mode voltage components in a range including the entirety of its operating voltage. To provide this capability for one end of the common-mode range a long-tailed pair connection of depletion-mode field effect transistors with gates at the inverting and non-inverting input terminals of the amplifier is used; and to provide this capability for the other end of the common-mode range the substrates of the transistors are biased to operate them in effect as enhancement-mode transistors allowing their drains to work into a current mirror amplifier used for converting their balanced drain variations to single-ended form. Current mirror amplifier configurations are disclosed which are preferable for such conversion since they operate with reduced potential requirements, but are integrable in CMOS.

33 Claims, 7 Drawing Figures

DIFFERENTIAL-INPUT AMPLIFIER CIRCUITRY WITH INCREASED COMMON-MODE VOLTAGE RANGE

This invention relates generally to differential-input amplifiers and, more particularly, to ones having increased capability to amplify input signals with common-mode voltage components approaching their supply voltages.

Of particular concern are differential-input amplifiers constructed using complementary metal-oxide semiconductor (CMOS) transistor technology, although aspects of the invention have application in other field-effect transistor (FET) technologies as well.

An aspect of the invention is the use of especially biased first and second depletion-mode FET's in long-tailed-pair connection as a basic building block of the differential input amplifier, with their respective gate electrodes at the inverting and non-inverting input terminals of the differential-input amplifier. Their depletion-mode characteristics permit the gates of the FET's to be swung towards cut-off by common-mode voltage past the supply voltage to which their tail connection is returned, under which conditions their substrates are biased with relatively little voltage offset with respect to their source electrodes. As the gates of these FET's are swung in the opposite direction, however, their substrates are biased with increased voltage offset with respect to their source electrodes to operate them in effect as enhancement-mode FET's. So, when their gates are swung past the supply voltage to which their drains connect, their source-to-drain voltages can be reduced without appreciably interfering with transistor operation. This permits a conventional bipolar-transistor current mirror amplifier to be employed as a differential-to-single-ended signal converter, without requiring auxiliary supply voltage.

A further aspect of the invention is the development of current mirror amplifiers (CMA's) which can be constructed in CMOS technology, but which can be used with as small biasing potential requirements as a bipolar-transistor CMA realized in conventional bipolar I.C. technology. The new types of CMA are modifications of the present inventor's "CURRENT AMPLIFIER" of U.S. Pat. No. 4,008,441 issued Feb. 15, 1977 using bipolar master and slave mirroring transistors, with the master mirroring transistor provided direct-coupled collector-to-base feedback via a source-follower FET for conditioning it to operate to convert input current to a voltage subsequently converted by the slave mirroring transistor to an output current. Each of the new types of CMA uses a source-follower FET that is of depletion-mode type with its source biased from a constant current generator for obtaining decreased input offset voltage requirements. Such constant current generator may employ another FET of depletion-mode type, self-biased by gate-to-source connection, and supplying current at its drain. The same input offset voltage reducing techniques can be used in the amplifier stage ensuing a differential-input amplifier using one of these new types of CMA as balanced-to-single-ended converter, in a still further aspect of the present invention.

Figure 1:
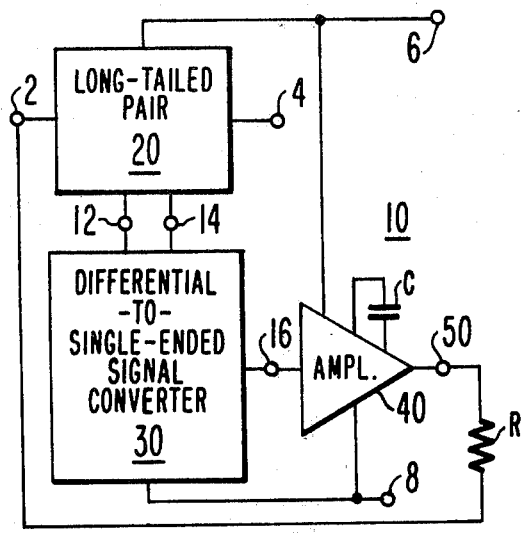
FIG. 1 is a block schematic diagram of a differential-input amplifier configuration in which the present invention may be embodied.

In the amplifying circuit 10 of FIG. 1, generally known in the prior art, long-tailed pair (LTP) 20 receives input signals at input terminals 2 and 4 and withdraws tail-current from supply terminal 6. Output signals from long-tailed pair 20 are supplied from the output connections thereof to nodes 12 and 14 and thence to the input connections of differential to single-ended signal converter 30. Converter 30 has a common connection to supply terminal 8 and an output connection supplying signals to node 16. Amplifier 40 receives signals from node 16 and supplies output signals to output terminal 50.

Long-tailed pair 20 in accordance with an aspect of the present invention is of a type that supplies output signals to nodes 12 and 14 when the common-mode voltage component of the input signals at terminals 2 and 4 approaches or goes beyond the potentials at either or both of supply terminals 6 and 8. Such operation is achieved with potentials at nodes 12 and 14 being between the potentials at supply rails 6 and 8, and being closer to that at supply terminal 8.

Differential-to-single-ended signal convertor 30 in accordance with another aspect of the present invention is of a type providing output signals to node 16 related to the differences between the signals received from nodes 12 and 14 and exhibiting such performance when the potentials at nodes 12 and 14 approach the potential at supply terminal 8.

Amplifying circuit 10 exhibits a gain vs. frequency characteristic that normally is subject to a dominant pole, shown symbolically as capacitor C in FIG. 1. Direct-coupled degenerative feedback may be used in circuits employing amplifier 10, which feedback may be obtained by a connection between output 50 and inverting input 2, for example, as by resistor R.

Figure 2:
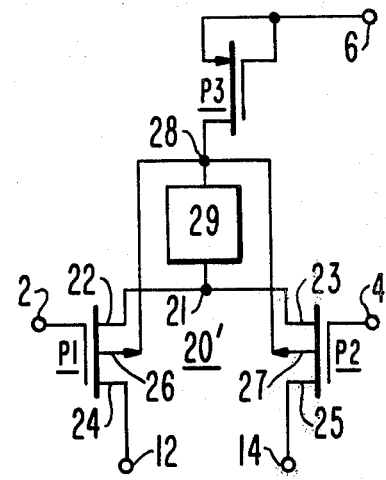
FIGS. 2, 4 and 5 are schematic diagrams embodying aspects of the present invention.

FIG. 2 shows long-tailed pair 20' of a type which may be employed in amplifying circuit 10. P-channel field-effect transistors (FET) P1 and P2 receive input signals at their gates from terminals 2 and 4 and have their sources 22 and 23 connected together at node 21 to receive tailcurrent. The tail current may be supplied from the drain of a P-channel FET with source connected to supply terminal 6, with drain connected to node 21 via potential offsetting means 29, and with gate provided fixed bias respective to its source electrode. Where P3 is a depletion-mode transistor, direct connection of gate to source, as shown in FIG. 2, conditions P3 to function as a constant current generator between its source and drain electrodes, so long as sufficient source-to-drain voltage is available to it. Output signals are supplied from the drains 24 and 25 of P1 and P2 to nodes 12 and 14, respectively. Substrate electrodes 26 and 27 of P1 and P2 connect to node 28 to be biased to a potential between those at supply terminal 6 and at node 21.

Figure 3:
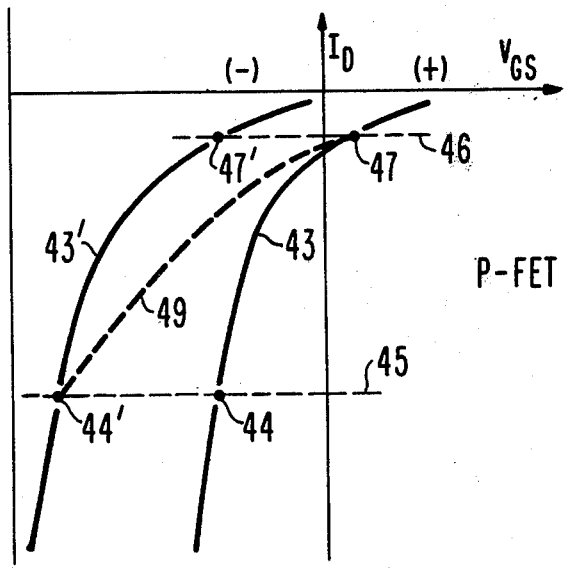
FIGS. 3 and 6 show characteristics of field-effect transistors.

Assume FETs P1 and P2 to be of conventional depletion-mode type—e.g., metal-oxide-semiconductor or junction-isolated FETs—exhibiting the drain current ($I_D$) versus gate-to-source voltage ($V_{GS}$) characteristic 43 of FIG. 3. Applying an offset voltage between the respective source and substrate electrodes of P1 and P2 results in their exhibiting a modified $I_D$-vs.-$V_{GS}$ characteristic 43', which resembles that of an enhancement-mode FET, when that offset potential biases the substrate beyond the source pontential in the direction away from the drain potential. A substantially larger $V_{GS}$ 44' is required to sustain a given level of $I_D$ 45 (nominally equal to half normal tail current from P3) in P1 and P2 with substrate offset potential applied than the $V_{GS}$ 44 which is required to sustain $I_D$ level 45 with a depletion-mode FET with its substrate electrode connected to its source electrode.

Because the substrate is isolated from the FET channel by a diode inherent in the FET construction, which diode is reverse biased by the offsetting potential, substantially no current flows in the substrate electrode.

Figure 6:
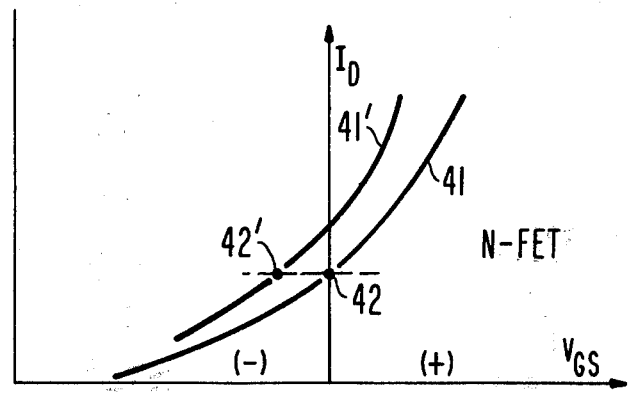

Several modes of control of $V_{GS}$ may be discerned from FIG. 6. Firstly, in a voltage-mode (V-mode), $V_{GS}$ may be varied, for example, from 44 towards 44' by varying the substrate-to-source offset potential thereby causing the corresponding exhibited $I_D$-vs.-$V_{GS}$ characteristic to shift from 43 towards 43'. Secondly, in a current-mode (I-mode), $V_{GS}$ may be varied, for example, from 44 towards 47 by varying the current $I_D$ supplied to the FET from level 45 towards level 46. A combination-mode (R-mode) occurs when the substrate-to-source offset potential and the current $I_D$ are both varied and $V_{GS}$ moves, for example, from 44' to 47 along locus 49. This locus 40 is followed in the operating characteristics of P1 and P2 as the common mode voltage at their gates swings upwards towards the operating voltage at terminal 6, if block 29 consists of a resistor connecting nodes 21 and 28.

When the gate potentials of FETs P1 and P2 have a common-mode component that is close to the supply voltage at terminal 8, these larger $V_{GS}$'s 44' permit their source potentials to be considerably closer to the supply voltage at terminal 6 than are their gate potentials. So the drain potentials of FETs P1 and P2, which can approach their source potentials without failure of transistor action, can be sufficiently offset from the supply voltage at terminal 8 to accommodate the biasing requirements of a conventional bipolar transistor current mirror amplifier used as differential to single-ended signal converter 30, for converting the variations in the drain currents of FETs P1 and P2 to single-ended form, despite the common-mode component of the gate potentials of P1 and P2 swinging down to or even beyond the supply voltage at terminal 8.

When the common-mode component of the gate potentials of FETs P1 and P2 approaches the supply voltage at terminal 6, their source-follower action causes node 21 to correspondingly approach that supply voltage. This is done through the action of potential offsetting means 29 and FET current generator P3, as explained later, and reduces the reverse biasing of substrate electrode 26,27 of FETs P1 and P2 respective to their source electrodes 22,23. So the modified $I_D$-vs.-$V_{GS}$ characteristic 43' of P1 and P2 asymptotically approaches that of $I_D$-vs.-$V_{GS}$ characteristic 43 at lower levels—e.g., 46—of tail current. Thus the common-mode component of the gate potentials of P1 and P2 can approach the supply voltage at terminal 6 much more closely, (e.g. in excess of 1 volt improvement) without completely cutting off the supply of tail current from FET P3 than would be possible were FETs P1 and P2 replaced by FETs with substrate electrodes directly connected to their source electrodes and of enhancement-mode type (for achieving the same $I_D$-vs.-$V_{GS}$ characteristics when the common-mode component of their gate potentials approaches the supply voltage at terminal 8).

In LTP 20' of FIG. 2, an offset potential is developed across potential offsetting means 29 in response to the tail current supplied from the drain of constant current generator FET P3 flowing therethrough. Except, however, when the common-mode voltage component of the gate potentials of P1 and P2 approaches the supply voltage at terminal 6, whereupon FET P3 begins to behave more like a resistive element than a constant current generator.

Figure 4:
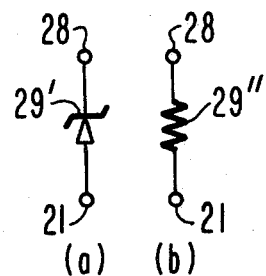

If potential offsetting means 29 is, for example, an avalanche diode 29' as shown in FIG. 4(a), the offset voltage between the respective source and substrate electrodes of FETs P1 and P2 results in their exhibiting modified $I_D$-vs.-$V_{GS}$ characteristic 43', even with a substantial reduction in the current supplied by P3. This arrangement operates primarily in the I-mode described above so that P1 and P2 receive substantially fixed substrate-to-source offset potential and operate at quiescent point 44' over substantially the entire range of common-mode component of gate potential. However, when that potential approaches the potential at supply 6 more closely than a predetermined value (determined by the offsetting potential of means 29 and the $I_D$-vs.-$V_{GS}$ characteristics of P1 and P2), the $V_{DS}$ of FET P3 is sufficiently reduced so that it no longer generates constant current, but rather the current therefrom decreases and the quiescent operating points of P1 and P2 tend to move along characteristic 43' towards quiescent point 47'. Ultimately, at very low P3 current levels, the potential across avalanche diode 29' will decrease causing the operating point to tend to move along current level 46 towards operating point 47, i.e. in the V-mode.

If potential offsetting means 29 is, for example, resistor 29" as shown in FIG. 4(b), the offset voltage between the respective source and substrate electrodes of P1 and P2 is proportionately responsive to the current supplied by P3. When the common-mode component of gate potentials of P1 and P2 is in that portion of its range wherein P3 serves as a constant current generator, this arrangement applies a substantially fixed substrate-to-source offset voltage to P1 and P2 whereupon they exhibit modified $I_D$-vs.-$V_{GS}$ characteristic 43'. However, when that common-mode component of gate potential approaches the potential at supply 6 more closely than a predetermined value, the $V_{DS}$ available to P3 diminishes sufficiently that it no longer generates constant current, but rather the current supplied therefrom decreases in value. Responsive thereto, the potential across offsetting resistor 29" decreases and the combination of effects causes modified $I_D$-vs.$V_{GS}$ characteristic 43' of P1 and P2 to asymptotically approach characteristic 43 while the $I_D$ current level 45 decreases to level 46, i.e., operation is in the R-mode.

The range of common-mode voltage at the gates of FETs P1 and P2 may be shifted with respect to the voltages at supply terminals 6 and 8 without adversely affecting the magnitude of that range that can be accommodated, and without adversely affecting amplifier linearity, by varying the degree of depletion or enhancement of the $I_D$-vs.$V_{GS}$ characteristics exhibited by FETs P1 and P2. Such ranges may be predetermined to include the voltage at supply terminal 6 or the voltage at supply terminal 8 or the voltages at both supply terminals 6 and 8. When one wishes to achieve a range of common-mode voltages associated with acceptable operation that includes the supply voltages at terminals 6 and 8, the input bias requirements of differential to single-ended signal converter 30 should be kept small. (When one wishes to include the supply voltage at terminal 6 in the range of acceptable common-mode voltages, by the way, it is advantageous to construct FETs P1 and P2 with a smaller ratio of channel-width to channel-length than that of FET P3, and with a greater degree of depletion so that quiescent point 47 corresponds to positive $V_{GS}$ for P-FETs, as shown in FIG. 3.)

While the requirement for differential to single-ended signal conversion with samll input bias requirements is easily met using conventional bipolar current mirror amplifiers (as described by H. C. Lin in U.S. Pat. No. 3,391,311 issued July 7, 1968 and entitled "Constant Current Gain Composite Transistor") together with a grounded-emitter transistor if one is working in an integrated-circuit technology where bipolar transistors with appreciable current gain as well as FETs are available, this requirement is a formidable one in an integrated circuit technology such as CMOS where bipolar transistors with appreciable current gain are not available. CMOS does have available a lateral-structure NPN of low current gain, however. These transistors tend to be unsuitable for conventional differential to single-ended signal converters due to errors introduced because the base currents of the transistors are not negligibly small as compared to their collector currents. Differential to single-ended signal converter arrangements were sought in which the low current gain of these lateral structure NPN transistors was compensated for by source follower FETs, while at the same time avoiding the relatively larger input bias requirements between source and gate electrodes of an enhancement-mode FET.

Figure 5:
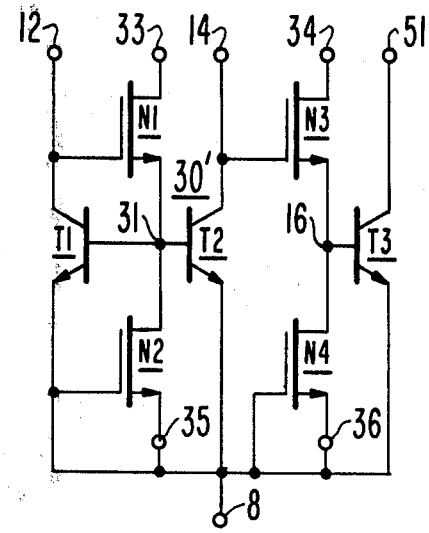

FIG. 5 shows a differential-to-single ended signal converter 30' that is of the desired type. NPN bipolar transistors T1 and T2 have similar emitter-to-base potentials conditioning them to conduct proportional currents from nodes 12 and 14, respectively, to supply terminal 8 via their respective collector-to-emitter paths. N-channel field effect transistor N1 is preferably a depletion-mode transistor connected as a source follower for providing direct-coupled feedback between the collector and base of T1. FET N1 receives operating potential at its drain from terminal 33, which potential is positive with respect to that at node 31 between the bases of T1 and T2 and may, for example, be the potential at supply terminal 6. The base currents of T1 and T2 flow through the drain-to-source path of FET N1 and so do not affect the currents withdrawn from nodes 12 and 14. N-channel, FET N2 is also preferred to be a depletion-mode FET and operates at substantially zero gate-to-source potential difference for withdrawing its drain current from node 31. The source of N2 receives operating potential at node 35 which potential is relatively negative with respect to that at node 31 and, for example, may be the potential at supply terminal 8.

The operation of source-follower transistor N1 responsive to the source current withdrawn by constant current generator N2 may be understood by reference to depletion-mode transconductance characteristics 41, 41' shown in FIG. 6. FET N2 exhibits transconductance characteristic 41 and operates at quiescent point 42 at $V_{GS}=0$. Drain current $I_D$ established therein is substantially equal to the source current supplied by FET N1 through node 31. Where the ratio of channel-width to channel-length for N1 and N2 are made substantially equal, both exhibit transconductance characteristic 41. Therefore, FET N1 will operate at quiescent point 42 and will exhibit a gate-to-source potential that is substantially zero. So the potential at the collector of T1 will be substantially equal to the potential at its base and will be maintained at a single junction offset voltage from the supply voltage at terminal 8. Of course, as will be realized by one skilled in the art, the collector currents and potentials of T1 and T2 are maintained in the environment of amplifiers 10, for example, in cooperation with direct-coupled degenerative feedback.

Alternatively, if the ratio of channel-width to channel-length of N1 is made larger than that of N2, FET N1 will exhibit transconductance characteristic 41' of FIG. 6 and, having its quiescent current substantially determined by the quiescent current of N2, will operate at point 42'. As a result thereof, the negative-gate-to-source operating potential of N1 causes the collector of transistor of T1 to operate at a potential approaching that at supply terminal 8 even more closely than the potential at node 31.

The base-to-emitter potential of bipolar transistor T1 is logarithmically related to the collector current therethrough so that, by the follower action of FET N1, the potential at the collector of T1 is logarithmically related to the current supplied thereto from node 12. The collector current of T2 is similarly related to the potential at node 31 so that the current drawn from node 14 is directly related to the current supplied from node 12 and therefore the combination of transistors N1, N2, T1 and T2 comprise a current mirror amplifier receiving input current from node 12 and supplying output current to node 14.

FETS N3 and N4 receive operating potentials at terminals 34 and 36 and operate in like manner to FETs N1 and N2 so that the source-follower action of N3 determines the collector potential of T2 (at node 14) responsive to the base-emitter potential (at node 16) of grounded-emitter bipolar transistor T3. T3 however, performs a dual function i.e., within converter 30' it establishes a potential at node 16 and within amplifier 40 it supplies current to terminal 51.

Differential-to-single ended converter 30' provides several operating advantages, the most important of which is permitting the potentials at nodes 12 and 14 to approach the supply voltage at terminal 8 for operating in cooperation with long-tail pair 20. The potentials at nodes 12 and 14 are substantially equal and constant, so the gain of the T1-T2 current mirror amplifier is not affected by potential variations at its input and output connections. Further advantage is obtained from the high input resistance exhibited by the gates of FETs N1 and N3 eliminating current gain errors associated with bipolar transistor base currents. In effect, N1 and N3 permit the low current gain NPN transistors T1-T3 obtained in a CMOS technology to be employed as if they had higher gain.

While FETs could be used in place of T1 and T2, bipolar transistors are particularly advantageous because the potentials at nodes 12 and 14 may be maintained more closely to the potential at supply 8. As used in converter 30, bipolar transistors exhibit lower resistance at node 31 and higher transconductance than would FETs thereby providing increased bandwidth and reduced noise.

Figure 7:
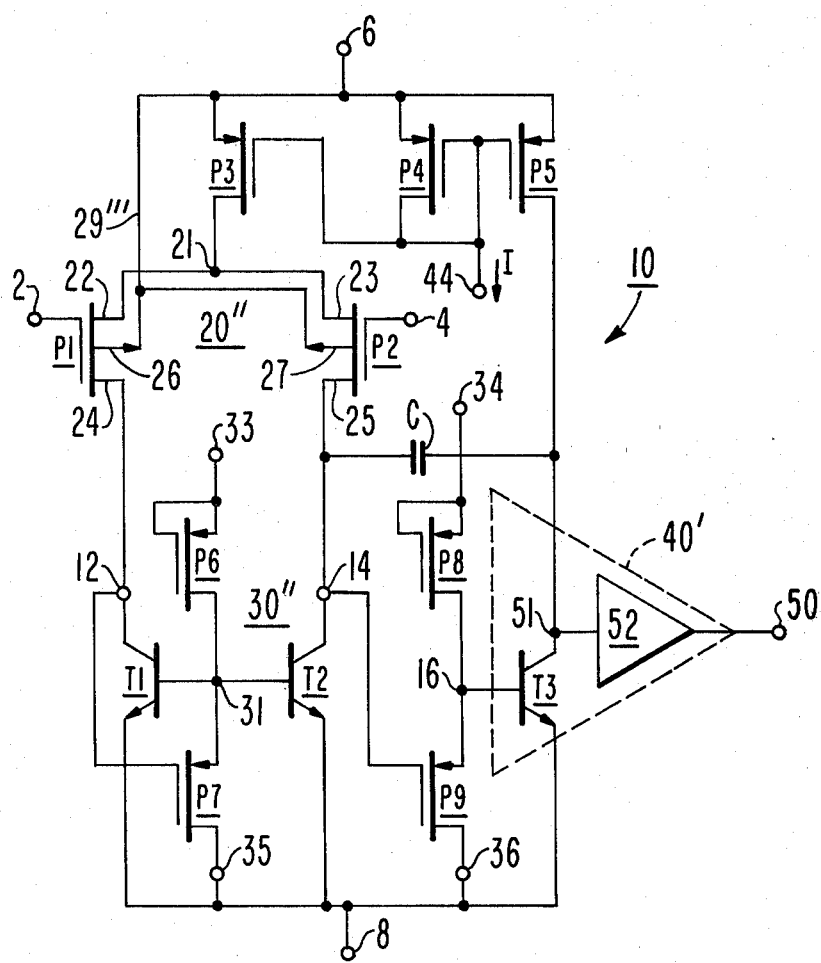
FIG. 7 is a schematic diagram of an operational amplifier circuit embodying the present invention.

FIG. 7 shows a specific embodiment of amplifying circuit 10 including specific types 20" and 30" of LTP 20 and differential to single-ended signal converter 30. Operating currents for amplifier 10 are established by a current mirror amplifier including P-FET P4 connected as a master diode cooperating with slave transistors P3 and P5 for supplying tail current to node 21 and collector current to T3 respectively, in response to bias current I withdrawn from terminal 44, for example, by a resistor connected between terminals 44 and 48.

Long-tailed pair 20" in FIG. 7 operates similarly to LTP 20' described above except that alternative means 29''' for applying an offset potential is employed. Substrate electrodes 26,27 are connected for receiving the potential at supply terminal 6, which potential is offset from that at the source interconnection 21 by the drain-source voltage of P3. Because P1 and P2 serve as source followers responsive to the common-mode component of their gate potentials, the potential at node 21 is directly related to that common-mode component and the substrate (26,27) to source (22,23) bias potential is directly varied thereby. That substantially direct control of substrate-to-source bias over the range of linear operation of LTP 20" affects the degree of depletion-mode operation of P1 and P2 between $I_D$-vs.-$V_{GS}$ characteristic 43 and characteristic 43' as the coommon-mode component of gate potential moves from a potential close to that at supply terminal 6 to that at supply terminal 8, respectively. In FIG. 3, the quiescent operating points of P1 and P2 correspondingly tend to move from point 44 to point 44', i.e. V-mode operation. However, when that common-mode potential approaches the potential at supply terminal 6 more closely than a predetermined value (substantially determined by $V_{GS}$ of P1 and P2 on characteristic 43), FET P3 tends to operate more as a resistor causing the operating points of P1 and P2 to tend to move along characteristic 43 towards quiescent point 47.

In FIG. 7, differential-to-single ended converter 30" operates similarly to converter 30' described above but with P-channel depletion-mode FETs P7 and P9 serving as source followers in like fashion to N-FETs N1 and N3 of FIG. 5. Similarly, P-channel depletion-mode FETs P6 and P8 establish operating currents in like manner to N-FETs N2 and N4 of FIG. 5. The potentials at nodes 12 and 14 are thereby maintained substantially equal to each other and approach the potential at supply terminal 8. The potential at node 12 is logarithmically related to the current applied thereto and is maintained between the potential at node 31 and that at supply 8. Further, the collector currents of T2 and T3 are related to the current applied to node 12 by current-mirror amplifier action similar to that described hereinabove for FIG. 5.

Single-ended signals from signal converter 30" at the collector of T2 are coupled to node 16 by the source-follower action of FET P9 and thence further amplified by amplifier 40' and supplied to output terminal 50. Transistor T3, in its role as a grounded-emitter amplifier within amplifier 40' receives signal at its base and amplified response thereto is coupled from its collector to output 50 by amplifier 52, which may be of a type known to those skilled in the art. Quiescent collector current is supplied to T3 by current mirror P4, P5 responsive to bias current I.

Capacitor C, connected between the collector of T3 and the input to source follower P9 at node 14, provides capacitively coupled feedback for controlling the gain versus frequency characteristics of amplifier 10. The high input resistance exhibited by the gate of FET P9 is particularly advantageous in that capacitor C may be of small value owing to the Miller-effect from transistor T3.

Particular advantage accrues when amplifying circuits of the type described herein are constructed in integrated circuit form. In the circuit of FIG. 7, for example, the matching achievable between P1, P2 and P3 characteristics enhances the common-mode voltage range for linear operation while the matching between P6-P7 and P8-P9 assures the desired input-output offset potentials of source followers P7 and P9 without sensitivity to processing variations.

In a particular embodiment, constructed in accordance with FIG. 7, only P-channel FETs were employed to effect simplified processing of the integrated circuit wafer and low value resistors were inserted into the connections of certain transistors as follows:

FET P3 source: 20 ohms;
FET P4 source: 20 ohms;
FET P5 source: 10 ohms;

T1 emitter: 10 ohms;
T2 emitter: 10 ohms;

FET P7 drain: 100 ohms, and
FET P9 drain: 100 ohms.

When operated with +10 volts applied to terminals 6, 33 and 34 (connected together) with respect to terminal 8, and with a 75 kilohm resistor connected between terminals 44 and 8, the quiescent drain currents were as follows:

FETs P1 and P2: 50 microamperes each,
FET P3: 100 microamperes
FET P4: 100 microamperes
FET P5: 200 microamperes,
FETs P6 and P7: 28 microamperes each, and
FETs P8 and P9: 28 microamperes each.

Capacitor C is 20 picofarads, and amplifier 52 includes an NPN bipolar transistor in emitter-follower configuration with its collector connected to terminal 6, its base connected to the collector of T3, and its emitter connected to output terminal 50 and thence to terminal 8 through a 500 microamperes constant-current source.

While the foregoing describes several embodiments of Applicant's invention, further embodiments would be evident to one skilled in the art of design when armed with the teaching of this disclosure. For example, LTP 20' may be used in cooperation with converter 30', 30" or alternative embodiments thereof. LTP 20', 20" or alternative embodiments thereof are likewise interchangeable. Long-tailed pair 20 may employ field-effect transistors of opposite conductivity type to those shown with corresponding changes in the conductivity type of other transistors and the appropriate relative polarity of the operating voltages at supply terminals 6 and 8, as is known to those skilled in the art. Enhancement-mode FETs could be employed in signal converters 30', 30" should one not be concerned by the additional circuitry that would be necessary for providing bias potentials therefor. As a further example, terminals 33, 34 and 44 in FIG. 7 can be connected in common for making amplifier 10 self-biasing.

As used herein, the substrate of the FET is that material into which the channel is induced, which material is of opposite conductivity type to that of the induced channel. For example, in a P-channel FET, the substrate would be of N-type material, the drain and source electrodes would each be of P-type material, and the field-effect would induce a P-channel region within the N-type substrate material. In an integrated circuit embodiment of that P-FET, the substrate region might alternatively be referred to as an N-well, N-tub, N-boat, or isolation well region which is diffused into a P-type silicon semiconductor wafer.

What is claimed is:

1. An amplifying circuit operable with input signals having a common-mode component anywhere within a range approaching and including at least one of the operating potentials applied to said amplifying circuit, in combination:

first and second supply terminals for receiving operating potential therebetween;

first and second field-effect transistors of a first conductivity type, each having gate, drain, source and substrate electrodes;

means for connecting said first and second transistors in long-tailed-pair connection including first and second input terminals to which the respective gate electrodes of said first and second transistors connect for receiving input signals, a tail connection to which the respective source electrodes of said first and second transistors connect for receiving a tail current, first and second output connections to which the respective drain electrodes of said first and second transistors connect;

tail current supply means connected between said first supply terminal and said tail connection for supplying said tail current;

means for applying offsetting potentials between the respective substrate and source electrodes of both said first and second transistors, which offsetting potentials are of a polarity for maintaining the potential at the respective substrate electrodes of said first and second transistors closer to the potential at said first supply terminal than is the potential at the source electrodes of said first and second transistors, said offsetting potentials varying responsive to said common-mode component for tending to operate said first and second transistors towards depletion mode when the value of said common-mode component approaches the potential at said first supply terminal more closely than a predetermined voltage and tending to operate said first and second transistors towards enhancement mode when the value of said common-mode component departs from the potential at said first supply terminal by more than said predetermined voltage, said offsetting potentials conditioning said long-tailed pair connection for providing signals at its output connections responsive to said input signals when the common-mode component of said input signals is at a potential between the potentials at said first and second supply terminals and including at least the potential at one of said first and second supply terminals; and differential to single-ended signal converting means including:

third and fourth transistors of a second conductivity type, having respective output electrodes connected respectively to the first and second output connections of said long-tailed-pair connection, having respective input electrodes, and having respective common electrodes connected to said second supply terminal, potential-follower means with an input connection at the output electrode of said third transistor and with an output connection at an interconnection between the respective input electrodes of said third and fourth transistors, which potential-follower means is for exhibiting a predetermined offsetting potential between its input and output connections to operate the output electrode of said third transistor at a potential between the potential at the input electrode of said third transistor and the potential at said second supply terminal including the potential at the input electrode of said third transistor, and, output means for operating the output electrode of said fourth transistor at a potential between the potential at the input electrode of said fourth transistor and the potential at said second supply terminal including the potential at the input electrode of said fourth transistor, and for supplying output signals related to the difference between the signals at the first and second output connections of said long-tailed-pair connection.

2. The amplifying circuit of claim 1 wherein said means for applying offsetting potentials includes connections of the respective substrate electrodes of said first and second transistors to said first supply terminal.

3. The amplifying circuit of claim 1 wherein said means for applying offsetting potentials includes:

means interposed between said tail current supply means and the respective source electrodes of said first and second transistors for generating offsetting potential responsive to the flow of tail current therethrough; and connections of the respective substrate electrodes of said first and second transistors to the interconnection between said tail current supply means and said means for generating offsetting potential.

4. The amplifying circuit of claims 1, 2, or 3 wherein said tail current supply means comprises:

a fifth transistor of field-effect type and of like conductivity type to said first and second transistors, having a source electrode connected to said first supply terminal, having a drain electrode connected for supplying said tail current, and having a gate electrode; and means for applying biasing potential to the gate electrode of said fifth transistor for conditioning said fifth transistor for supplying said tail current.

5. The amplifying circuit of claim 3 wherein said means for generating offsetting potential exhibits offsetting potential that is substantially constant so long as tail current flows therethrough.

6. The amplifying circuit of claim 5 wherein said means for generating offsetting potential is an avalanche diode.

7. The amplifying circuit of claim 3 wherein said means for generating offsetting potential exhibits offsetting potential that is proportionally responsive to said tail current.

8. The amplifying circuit of claim 7 wherein said means for generating offsetting potential is resistance means.

9. The amplifying circuit of claim 1 wherein said potential-follower means includes:

a fifth transistor of field-effect, depletion-mode type having a source electrode connected to the output connection of said potential-follower means, having a gate electrode connected to the input connection of said potential-follower means, and having a drain electrode;

means for connecting the drain electrode of said fifth transistor to one of said first and second supply terminals; and constant current supplying means connected to the source electrode of said fifth transistor for supplying a substantially constant current thereto for biasing said fifth transistor for establishing a predetermined potential between the gate and source electrodes thereof.

10. The amplifying circuit of claim 9 wherein said constant current supplying means includes a sixth transistor of field-effect, depletion-mode type having gate and source electrodes connected together and having a drain electrode connected to the source electrode of said fifth transistor; and means for connecting the interconnection of the gate and source electrodes of said sixth transistor to the other of said first and second supply terminals.

11. The amplifying circuit of claim 10 wherein said fifth and sixth transistors respectively have substantially equal ratios of channel-width to channel-length for making the potentials at the gate and source electrodes of said fifth transistor substantially equal.

12. The amplifying circuit of claim 10 wherein said fifth and sixth transistors have ratios of channel-width to channel-length that are not equal, which ratios are scaled for making the potential at the gate electrode of said fifth transistor substantially closer to the potential at said second supply terminal than is the potential at the source electrode thereof.

13. The amplifying circuit of claim 11 or 12 wherein said fifth and sixth transistors are of like conductivity type.

14. The amplifying circuit of claim 1 wherein said output means includes:

a fifth transistor of like conductivity type to that of said third and fourth transistors, said fifth transistor having a common electrode connected to said second supply terminal, having an output electrode connected for supplying output signals therefrom, and having a base electrode; and further potential-follower means with an input connection at the output electrode of said fourth transistor and with an output connection at the input electrode of said fifth transistor, which potential-follower means is of a type exhibiting a predetermined offsetting potential between its input and output connections to operate the output electrode of said fourth transistor at a potential between the potential at the input electrode of said fourth transistor and the potential at said second supply terminal including the potential at the input electrode of said fourth transistor.

15. The amplifying circuit of claim 14 wherein said further potential-follower means includes:

a sixth transistor of field-effect, depletion-mode type having a source electrode connected to the output connection of said potential-follower means, having a gate electrode connected to the input connection of said potential-follower means, and having a drain electrode;

means for connecting the drain electrode of said sixth transistor to one of said first and second supply terminals; and current supplying means connected to the source electrode of said sixth transistor for supplying a current thereto for biasing said sixth transistor for establishing a predetermined potential between the gate and source electrodes thereof.

16. The amplifying circuit of claim 15 wherein said current supplying means includes a seventh transistor of field-effect, depletion-mode type having gate and source electrodes connected together and having a drain electrode connected to the source electrode of said sixth transistor; and means for connecting the interconnection of the gate and source electrodes of said seventh transistor to the other of said first and second supply terminals.

17. The amplifying circuit of claim 16 wherein said sixth and seventh transistors respectively have substantially equal ratios of channel-width to channel-length for making the potentials at the gate and source electrodes of said sixth transistor substantially equal.

18. The amplifying circuit of claim 16 wherein said sixth and seventh transistors have ratios of channel-width to channel-length that are not equal, which ratios are scaled for making the potential at the gate electrode of said sixth transistor substantially closer to the potential at said second supply terminal than is the potential at the source electrode thereof.

19. The amplifying circuit of claim 17 or 18 wherein said sixth and seventh transistors are of like conductivity type.

20. A circuit for developing a voltage logarithmically related to the input current applied thereto, including a first bipolar transistor having emitter and collector electrodes, and having a base electrode connected to a first node, means for applying a current between the collector and emitter electrodes of said first bipolar transistor, a direct-coupled feedback connection responsive to the potential at the collector electrode of said first bipolar transistor, of an improved type for maintaining the potential between the collector and base electrodes of said first bipolar transistor at some predetermined value, comprising:

a first field-effect transistor of depletion-mode type, having a source electrode connected to said first node, having a gate electrode to which the collector electrode of said first bipolar transistor connects, and having a drain electrode connected for receiving a first operating potential; and constant current supplying means connected to the source electrode of said first field-effect transistor for supplying a substantially constant current thereto for biasing said first field-effect transistor for establishing said predetermined valued potential between the gate and source electrodes thereof.

21. A circuit of claim 20 connected in combination with a second bipolar transistor of like conductivity type to that of said first bipolar transistor, having a base electrode connected to said first node, having an emitter electrode connected to the emitter electrode of said first bipolar transistor, and having a collector electrode for supplying a current proportionally related to said input current.

22. A circuit as set forth in claim 20 wherein said constant current supplying means includes a second field-effect transistor of depletion-mode type, having gate and source electrodes connected in common for receiving a second operating potential and having a drain electrode connected to said first node, which second operating potential is oppositely poled to said first operating potential with respect to the potential at said first node.

23. A circuit as set forth in claim 22 wherein said first and second field-effect transistors respectively have substantially equal ratios of channel-width to channel-length for making the potentials at the collector and base electrodes of said first bipolar transistor substantially equal.

24. A circuit as set forth in claim 22 wherein the said first and second field-effect transistors have ratios of channel-width to channel-length that are not equal, which ratios are scaled for making the potential at the collector electrode of said first bipolar transistor closer to the potential at the emitter electrode thereof than is the potential at said first node.

25. A circuit as set forth in claim 22 or 24 wherein said first and second field-effect transistors are of like conductivity type.

26. A current amplifier comprising:
input, output, and common terminals;
first and second transistors of the same conductivity type, each having respective output and common electrodes defining the ends of its principal current conduction path, and each having a respective input electrode, the potential between the common and input electrodes of each said transistor controlling the conduction of its principal current conduction path, their output electrodes connecting respectively to said input terminal and to said output terminal, and their common electrodes connecting to said common terminal; and
means for maintaining the input electrodes of said first and second transistors at a potential respective to that at the output electrode of said first transistor and at least as remote from the potential at said common terminal, which means includes
a third transistor of depletion-mode, field-effect type and of a conductivity type similar to that of said first and second transistors, having a gate electrode to which the output electrode of said first transistor connects, having a source electrode directly connected at the input electrodes of said first and second transistors, and having a drain electrode, and further includes
means connected between the source and drain electrodes of said third transistor for supplying a substantially constant current to the source electrode of said third transistor to operate it as a source-follower amplifier exhibiting a predetermined potential between its gate and source electrodes.

27. The current amplifier of claim 26 wherein said first and second transistors are of bipolar type.

28. The current amplifier of claim 26 wherein the potential at the respective input electrodes of said first and second transistors is more remote from the potential at said common terminal than is the potential at the output electrode of said first transistor.

29. The current amplifier of claim 26 or 28 wherein said means for maintaining includes:
first and second supply terminals for receiving operating potentials thereat of first and second polarity sense with respect to the potential at the respective input electrodes of said first and second transistors;
means connecting the drain electrode of said third transistor to said first supply terminal; and
a fourth transistor of depletion-mode, field-effect type and of a conductivity type similar to that of said third transistor, having gate and source electrodes connected together and to said second supply terminal, and having a drain electrode connected to the respective input electrodes of said first and second transistors.

30. A current amplifier comprising:
input, output and common terminals;
first and second transistors of the same conductivity type, each having respective output and common electrodes defining the ends of its principal current conduction path, and each having a respective input electrode, the potential between the common and input electrodes of each said transistor controlling the conduction of its principal current conduction path, their output electrodes connecting respectively to said input terminal and to said output terminal, and their common electrodes connecting to said common terminal; and
means for maintaining the input electrodes of said first and second transistors at a potential respective to that at the output electrode of said first transistor and at least as remote from the potential at said common terminal, which means includes:
a third transistor of depletion-mode, field-effect type and of a conductivity type complementary to that of said first and second transistors, having a gate electrode to which the output electrode of said first transistor connects, having a source electrode directly connected at the input electrodes of said first and second transistors, and having a drain electrode, and further includes
means connected between the source and drain electrodes of said third transistor for supplying a substantially constant current to the source electrode of said third transistor to operate it as a source-follower amplifier exhibiting a predetermined potential between its gate and source electrodes.

31. The current amplifier of claim 30 wherein said first and second transistors are of bipolar type.

32. The current amplifier of claim 30 wherein the potential at the respective input electrodes of said first and second transistors is more remote from the potential at said common terminal than is the potential at the output electrode of said first transistor.

33. The current amplifier of claim 30 or 32 wherein said means for maintaining includes:
first and second supply terminals for receiving operating potentials thereat of first and second polarity sense with respect to the potential at the respective input electrodes of said first and second transistors;
means connecting the drain electrode of said third transistor to said first supply terminal; and
a fourth transistor of depletion-mode, field-effect type and of a conductivity type similar to that of said third transistor, having gate and source electrodes connected together and to said second supply terminal, and having a drain electrode connected to the respective input electrodes of said first and second transistors.

* * * * *